United States Patent
Shi

(10) Patent No.: US 10,306,766 B2
(45) Date of Patent: May 28, 2019

(54) FLEXIBLE DISPLAY PANEL AND METHOD OF MANUFACTURING THE SAME, AND FLEXIBLE DISPLAY APPARATUS

(71) Applicant: BOE Technology Group Co., Ltd., Beijing (CN)

(72) Inventor: Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 33 days.

(21) Appl. No.: 15/322,465

(22) PCT Filed: Dec. 28, 2015

(86) PCT No.: PCT/CN2015/099265
§ 371 (c)(1),
(2) Date: Dec. 28, 2016

(87) PCT Pub. No.: WO2017/031893
PCT Pub. Date: Mar. 2, 2017

(65) Prior Publication Data
US 2017/0215288 A1    Jul. 27, 2017

(30) Foreign Application Priority Data
Aug. 27, 2015 (CN) .................... 2015 2 0656651 U

(51) Int. Cl.
*G09F 9/30* (2006.01)
*H05K 1/02* (2006.01)
(Continued)

(52) U.S. Cl.
CPC .............. *H05K 1/189* (2013.01); *G09F 9/301* (2013.01); *H01L 27/3276* (2013.01);
(Continued)

(58) Field of Classification Search
None
See application file for complete search history.

(56) References Cited

U.S. PATENT DOCUMENTS 4,836,651 A * 6/1989 Anderson ........... G02F 1/13452
349/150
5,003,222 A * 3/1991 Washo ................... H05B 33/06
313/505
(Continued)

FOREIGN PATENT DOCUMENTS

CN    103887314 A    6/2014
CN    104103217 A    10/2014
(Continued)

OTHER PUBLICATIONS

International Search Report and Written Opinion of International Application No. PCT/CN2015/099265, dated May 24, 2015, 13 pages.
(Continued)

*Primary Examiner* — Dimary S Lopez Cruz
*Assistant Examiner* — Muhammed Azam
(74) *Attorney, Agent, or Firm* — Westman, Champlin & Koehler, P.A.

(57) ABSTRACT

The flexible display panel includes a flexible substrate, a display device, a driver chip and a connector, the connector is configured to electrically connect the flexible display panel to a system circuit board, the display device, the driver chip and the connector are all provided on the flexible substrate. The flexible substrate includes a first portion and a second portion which is bendable towards a back of the flexible display panel relative to the first portion. The second portion further includes a first region and a second region. The second region is bendable towards the back of the flexible display panel relative to the first region. In the flexible display panel, the flexible substrate is used in place (Continued)

of a conventional COF or FPC, such that physical and electrical connections between the flexible display panel and the system circuit board are achieved directly through the flexible substrate.

19 Claims, 6 Drawing Sheets

(51) Int. Cl.
    *H05K 1/14*     (2006.01)
    *H05K 1/18*     (2006.01)
    *H05K 3/00*     (2006.01)
    *H05K 3/10*     (2006.01)
    *H05K 3/32*     (2006.01)
    *H01L 27/32*     (2006.01)
    *H01L 51/00*     (2006.01)

(52) U.S. Cl.
    CPC ......... *H01L 51/0097* (2013.01); *H05K 1/028* (2013.01); *H05K 1/147* (2013.01); *H05K 3/007* (2013.01); *H05K 3/10* (2013.01); *H05K 3/32* (2013.01); *H01L 2227/323* (2013.01); *H01L 2227/326* (2013.01); *H01L 2251/5338* (2013.01); *H05K 2201/1003* (2013.01); *H05K 2201/10015* (2013.01); *H05K 2201/10022* (2013.01); *H05K 2201/10174* (2013.01); *H05K 2201/10287* (2013.01); *Y02E 10/549* (2013.01)

(56) References Cited

U.S. PATENT DOCUMENTS

| | | | | |
|---|---|---|---|---|
| 5,398,128 | A * | 3/1995 | Tajima | H01L 23/145 257/E23.007 |
| 5,434,362 | A * | 7/1995 | Klosowiak | H05K 1/028 174/254 |
| 5,436,744 | A * | 7/1995 | Arledge | G02F 1/13452 349/150 |
| 5,563,619 | A * | 10/1996 | Hilbrink | G02F 1/13452 345/104 |
| 5,838,412 | A * | 11/1998 | Ueda | G02B 6/0088 349/150 |
| 6,307,751 | B1 * | 10/2001 | Bodony | G06F 1/16 361/679.08 |
| 6,411,359 | B1 * | 6/2002 | Kobayashi | G02F 1/13452 349/149 |
| 6,600,222 | B1 * | 7/2003 | Levardo | H01L 23/5387 257/685 |
| 6,739,878 | B1 * | 5/2004 | Balzano | H05K 3/365 439/493 |
| 7,154,175 | B2 * | 12/2006 | Shrivastava | H01L 23/4985 257/723 |
| 7,364,440 | B2 * | 4/2008 | Gobron | H01R 13/025 439/77 |
| 7,453,700 | B2 * | 11/2008 | Miyata | G02F 1/13452 361/748 |
| 7,563,645 | B2 * | 7/2009 | Jaeck | H01L 23/5387 257/686 |
| RE41,039 | E * | 12/2009 | Forthun | H01L 23/4985 257/707 |
| 7,760,284 | B2 * | 7/2010 | Murase | G02F 1/13452 257/88 |
| 7,767,543 | B2 * | 8/2010 | Tateishi | A61J 3/00 438/456 |
| 7,772,501 | B2 * | 8/2010 | Ueda | H05K 1/028 174/254 |
| 8,023,284 | B2 * | 9/2011 | Sung | G06F 1/1601 361/749 |
| 8,106,307 | B2 * | 1/2012 | Hayakawa | H05K 1/141 174/254 |
| 8,724,038 | B2 * | 5/2014 | Ganapathi | G02B 26/0833 345/173 |
| 8,780,580 | B2 * | 7/2014 | Oohira | G02F 1/13452 361/749 |
| 8,908,257 | B2 * | 12/2014 | Song | G02F 1/167 359/254 |
| 9,148,951 | B2 * | 9/2015 | Kim | H05K 1/028 |
| 9,230,467 | B2 | 1/2016 | Chen et al. | |
| 9,271,402 | B2 | 2/2016 | Cho | |
| 9,326,375 | B2 | 4/2016 | Lee | |
| 9,515,102 | B2 * | 12/2016 | Zhou | H01L 27/12 |
| 9,583,855 | B2 * | 2/2017 | Ying | H01R 12/716 |
| 9,713,249 | B2 * | 7/2017 | Cheng | H05K 1/028 |
| 9,928,762 | B2 * | 3/2018 | Franklin | G09F 13/0413 |
| 9,933,870 | B2 * | 4/2018 | You | G06F 3/041 |
| 2001/0009299 | A1 * | 7/2001 | Saito | H01L 23/4985 257/684 |
| 2001/0033009 | A1 * | 10/2001 | Inoue | H05K 7/20963 257/668 |
| 2002/0117328 | A1 * | 8/2002 | Oishi | G02F 1/13452 174/254 |
| 2004/0159710 | A1 * | 8/2004 | Silverbrook | B41J 2/14427 235/492 |
| 2005/0088830 | A1 * | 4/2005 | Yumoto | G02F 1/13452 361/749 |
| 2005/0122700 | A1 * | 6/2005 | Kim | H05K 1/028 361/795 |
| 2005/0167803 | A1 * | 8/2005 | Imamura | G02F 1/13452 257/678 |
| 2006/0221269 | A1 * | 10/2006 | Kawaguchi | G02F 1/133308 349/58 |
| 2008/0180585 | A1 * | 7/2008 | Kubota | G06F 3/041 349/12 |
| 2009/0021666 | A1 * | 1/2009 | Chen | G02F 1/133305 349/58 |
| 2009/0032295 | A1 * | 2/2009 | Okajima | H05K 1/0203 174/260 |
| 2010/0085320 | A1 * | 4/2010 | Kuwajima | G02F 1/13338 345/173 |
| 2010/0148207 | A1 * | 6/2010 | Ryutani | H01L 23/13 257/99 |
| 2010/0279742 | A1 * | 11/2010 | Miyashita | G02F 1/13452 455/566 |
| 2011/0051382 | A1 * | 3/2011 | Yumoto | G02F 1/13452 361/749 |
| 2011/0074759 | A1 * | 3/2011 | Chae | H01J 11/10 345/211 |
| 2011/0187965 | A1 * | 8/2011 | Ooishi | G09F 13/04 349/62 |
| 2011/0279765 | A1 | 11/2011 | Oohira | |
| 2012/0098774 | A1 * | 4/2012 | Abe | G02F 1/133308 345/173 |
| 2012/0249927 | A1 * | 10/2012 | Nakagawa | G02F 1/133615 349/65 |
| 2012/0314383 | A1 * | 12/2012 | Oohira | G02F 1/13452 361/749 |
| 2013/0016303 | A1 * | 1/2013 | Tokunaga | G02F 1/133308 349/58 |
| 2013/0019207 | A1 * | 1/2013 | Rothkopf | G06F 1/1632 715/835 |
| 2013/0148312 | A1 * | 6/2013 | Han | H05K 7/00 361/736 |
| 2013/0273752 | A1 * | 10/2013 | Rudisill | H01R 13/6205 439/39 |
| 2013/0293816 | A1 * | 11/2013 | Jung | H01L 23/49827 349/139 |
| 2014/0042406 | A1 * | 2/2014 | Degner | H01L 27/326 257/40 |
| 2014/0049500 | A1 * | 2/2014 | Chen | G06F 3/0412 345/174 |
| 2014/0092034 | A1 * | 4/2014 | Franklin | G09F 13/0413 345/173 |
| 2014/0092338 | A1 * | 4/2014 | Miyazaki | G02F 1/13452 349/58 |
| 2014/0177182 | A1 * | 6/2014 | Cho | H05K 3/30 361/749 |
| 2014/0217382 | A1 * | 8/2014 | Kwon | H01L 51/0097 257/40 |

(56) References Cited

U.S. PATENT DOCUMENTS

| | | | | |
|---|---|---|---|---|
| 2014/0254756 A1* | 9/2014 | Tagawa | ................... | H01R 13/62 378/62 |
| 2014/0268595 A1* | 9/2014 | Eom | ....................... | H05K 1/028 361/749 |
| 2014/0285982 A1* | 9/2014 | Kim | ....................... | H05K 1/028 361/749 |
| 2014/0306348 A1* | 10/2014 | Ahn | .................... | H01L 23/4985 257/773 |
| 2014/0307396 A1* | 10/2014 | Lee | ........................ | H05K 1/028 361/749 |
| 2015/0021570 A1* | 1/2015 | Kim | .................... | H01L 51/0097 257/40 |
| 2015/0022953 A1* | 1/2015 | Cho | ........................ | H05K 1/028 361/679.01 |
| 2015/0036300 A1* | 2/2015 | Park | ....................... | H05K 1/147 361/749 |
| 2015/0187279 A1* | 7/2015 | Lee | ....................... | G09G 3/3225 257/40 |
| 2015/0230331 A1* | 8/2015 | Lee | ....................... | H05K 1/0259 361/220 |
| 2016/0113106 A1* | 4/2016 | Kim | ....................... | H05K 1/028 361/749 |
| 2016/0181345 A1* | 6/2016 | Lee | ..................... | H01L 27/3276 257/40 |
| 2016/0188059 A1* | 6/2016 | Lee | ....................... | G06F 3/0416 345/173 |
| 2016/0210894 A1 | 7/2016 | Lee | | |
| 2016/0306488 A1* | 10/2016 | Kim | ....................... | G06F 3/0416 |
| 2017/0215288 A1* | 7/2017 | Shi | ......................... | G09F 9/301 |

FOREIGN PATENT DOCUMENTS

| | | |
|---|---|---|
| CN | 104752485 A | 7/2015 |
| CN | 204884440 U | 12/2015 |
| JP | 2010192883 A | 9/2010 |
| TW | 201211958 A | 3/2012 |

OTHER PUBLICATIONS

English translation of Box No. V of the Written Opinion for the international Searching Authority for international Application No. PCT/CN2015/099265, 2 pages.

* cited by examiner

FLEXIBLE DISPLAY PANEL AND METHOD OF MANUFACTURING THE SAME, AND FLEXIBLE DISPLAY APPARATUS

CROSS-REFERENCE TO RELATED APPLICATION

This application is a Section 371 National Stage Application of International Application No. PCT/CN2015/099265, filed on Dec. 28, 2015, entitled "FLEXIBLE DISPLAY PANEL AND METHOD OF MANUFACTURING THE SAME, AND FLEXIBLE DISPLAY APPARATUS", which claims priority to Chinese Application No. CN201520656651.6, filed on Aug. 27, 2015, incorporated herein by reference in their entirety.

BACKGROUND

Technical Field

Embodiments of the present disclosure generally relate to the field of flexible display, and particularly, to a flexible display panel and a method of manufacturing the same, and a flexible display apparatus comprising the flexible display panel.

Description of the Related Art

With continuous development of technologies for a flexible display screen, the flexible display screen has got tremendous attention and research and become one of development tendencies in the future display field, due to its numerous characteristics, such as a light weight, a thin thickness, a shock resistance, flexibility and the like, which conventional display screens are lack of.

FIG. 1 shows a structure of a conventional flexible display panel 10. The conventional flexible display panel generally comprises a top film 11, a flexible substrate 14, a flexible printed circuit (FPC) board 19 and a bottom film 15; among others, a TFT device 13 and an OLED 12 are manufactured on the flexible substrate 14, a driver chip (IC) 16 is provided on a COF (Chip On Film) 18, and a connector 17 for connecting to a system circuit board (not shown) is provided on the flexible printed circuit (FPC) board 19, such that the flexible substrate is connected to the driver IC and the system circuit board through the COF and/or FPC, achieving driving of the flexible display panel. During manufacturing the conventional flexible display panel, however, it generally needs to bond the FPC onto the flexible substrate through a hot-pressing process, and deformation of a plastic substrate may occur during the hot-pressing, which will cause a trouble in alignment of the FPC with the flexible substrate. In addition, it will easily cause the flexible substrate to fall off from the bonding region during bending due to the flexible property of the flexible substrate.

SUMMARY

In order to solve at least one of the above problems and defects in prior arts, the present disclosure provides a flexible display panel and a method of manufacturing the same, and a flexible display apparatus comprising the flexible display panel.

According to an aspect of the present disclosure, there is provided a flexible display panel, comprising a flexible substrate, a display device, a driver chip and a connector, the connector being configured to electrically connect the flexible display panel to a system circuit board, the display device, the driver chip and the connector being all provided on the flexible substrate and being in contact with the flexible substrate, such that the flexible display panel is physically and configured to electrically connect to the system circuit board through the flexible substrate.

According to an embodiment of the present disclosure, the flexible display panel further comprises a wiring structure directly formed on the flexible substrate and electrically connecting the display device, the driver chip and the connector.

According to an embodiment of the present disclosure, the flexible substrate is a unitary flexible substrate which is integrally formed.

According to an embodiment of the present disclosure, the connector, or both the connector and the driver chip, is/are provided on a portion of the flexible substrate which is bendable towards a back of the flexible display panel.

According to an embodiment of the present disclosure, the flexible substrate comprises a first portion and a second portion, the display device is provided on the first portion, the connector is provided on the second portion; and the second portion is bendable towards a back of the flexible display panel relative to the first portion along a first fold line located between the first portion and the second portion such that the connector and the display device are positioned on two opposite sides of the flexible substrate respectively.

According to a further embodiment of the present disclosure, the driver chip is provided on the second portion such that the driver chip and the display device are positioned on two opposite sides of the flexible substrate respectively.

According to a further embodiment of the present disclosure, the flexible substrate comprises a first portion and a second portion, the display device is provided on the first portion, and the second portion is bendable towards the back of the flexible display panel relative to the first portion along a first fold line located between the first portion and the second portion; and the second portion further comprises a first region and a second region, the connector is provided on the second region, and the second region is bendable towards the back of the flexible display panel relative to the first region along a second fold line located between the first region and the second region. In an embodiment, the second fold line is perpendicular to the first fold line.

According to a further embodiment of the present disclosure, the flexible display panel further comprises a resistor, a capacitor, an inductor and/or a diode element, which are provided on the second portion.

According to a further embodiment of the present disclosure, the driver chip and/or the connector is/are fixed on the flexible substrate through a conductive adhesive, lead bonding or soldering. For example, the conductive adhesive includes an anisotropic conductive adhesive.

According to a further embodiment of the present disclosure, the driver chip is electrically connected with the connector and the display device via a conductive lead wire manufactured on the flexible substrate through a sputtering, coating or printing process.

According to a further embodiment of the present disclosure, a conductive lead wire is provided on the flexible substrate, and the connector has a pin connected with the conductive lead wire. For example, the pin is made of copper, a surface of the pin is plated with gold or nickel alloy, and the pin comprises a protrusion having a certain thickness.

According to a further embodiment of the present disclosure, a connection pin, which is subject to plating treatment, is formed on the flexible substrate, for soldering to a connector, a resistor, a capacitor, an inductor and/or a diode element.

According to a further embodiment of the present disclosure, a magnet is embedded in the connector, for connecting the connector to the system circuit board through attraction of the magnet.

According to another aspect of the present disclosure, there is provided a flexible display apparatus, comprising the flexible display panel of any one of the embodiments as described above.

According to a further aspect of the present disclosure, there is provided a method of manufacturing the above flexible display panel, comprising:

coating a film of flexible material on a carrier substrate to form the flexible substrate;

performing a semiconductor process on a portion of the flexible substrate so as to form the display device;

forming a wiring structure on another portion of the flexible substrate, the wiring structure being electrically connected with the display device;

cutting the flexible substrate into a desired display panel shape, and separating the flexible substrate from the carrier substrate, so as to obtain a panel structure including the display device and the wiring structure that is directly formed on the flexible substrate; and fixing a driver chip and/or a connector on the flexible substrate of the obtained panel structure, and electrically connecting the driver chip and/or the connector with display device through the wiring structure.

Other features and advantages of the present disclosure will become more apparent and the present disclosure will be comprehensively understood by reference to the following description of the present disclosure taken in conjunction with the accompanying drawings.

DETAILED DESCRIPTION OF PREFERRED EMBODIMENTS

Figure 1:
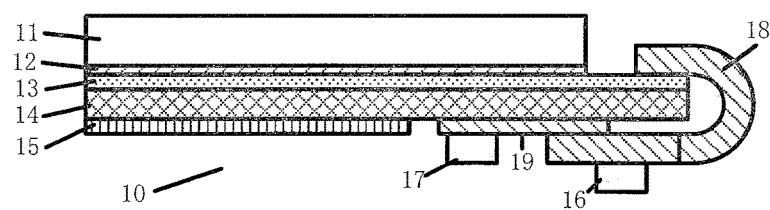
FIG. 1 is a side view of a conventional flexible display panel.

Exemplary embodiments of the present disclosure will be described hereinafter in detail with reference to the attached drawings. In the description, the like or similar reference numerals refer to the like or similar elements. The following description of embodiments of the present disclosure made with reference to the drawings is intended to illustrate a general inventive concept of the present disclosure and should not be construed as being limitative to the present disclosure.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general inventive concept of the present disclosure, there is provided a flexible display panel, comprising a flexible substrate, a display device, a driver chip and a connector, the connector being configured to electrically connect the flexible display panel to a system circuit board, the display device, the driver chip and the connector being all provided on the flexible substrate, such that the flexible display panel is physically and electrically connected to the system circuit board through the flexible substrate.

Figure 2:
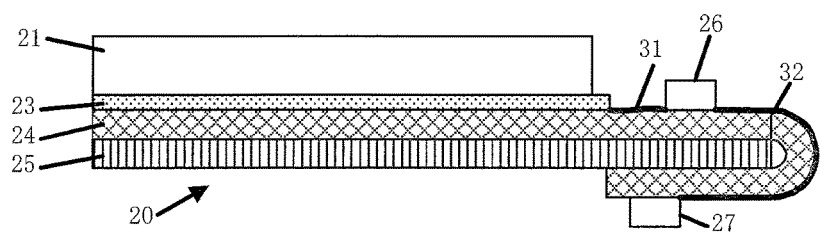
FIG. 2 is a side view of a flexible display panel according to an embodiment of the present disclosure.

FIG. 2 is a side view of a flexible display panel according to an embodiment of the present disclosure. In the embodiment shown in FIG. 2, the flexible display panel 20 comprises a top film 21, a display device 23 including a structure such as a thin film transistor, a pixel unit or the like, a flexible substrate 24 and a bottom film 25 arranged in sequence from top to bottom. In an example, the top film may comprise a circular polarizer, a touch film, a water and oxygen barrier film, a scratch resistant film or other optical film. The bottom film may comprise a water and oxygen barrier film or a film of PET, PEN, PI or the like, or may comprise a heat dissipation functional film such as a graphite sheet, a copper foil or the like. The flexible substrate 24 comprises a flexible substrate made of a plastic material, for example, a polyimide (PI) flexible substrate.

The flexible display panel further comprises a driver chip 26 configured to provide a drive signal to the display device and a connector 27 configured to electrically and/or mechanically connect the display panel to a system circuit board (i.e., a system board). Unlike the conventional flexible display panel 10 shown in FIG. 1, in the flexible display panel 20, the flexible substrate is used in replace of the conventional COF and/or FPC, that is, the flexible display panel 20 only utilizes a unitary piece of flexible substrate 24 which is integrally formed. Not only the display device 23 is provided on the flexible substrate 24, but also the driver chip 26 and the connector 27 are also provided on the flexible substrate 24, thereby eliminating the conventional COF and/or FPC for achieving electrical connections among the display device, the driver chip and the connector.

Figure 3:
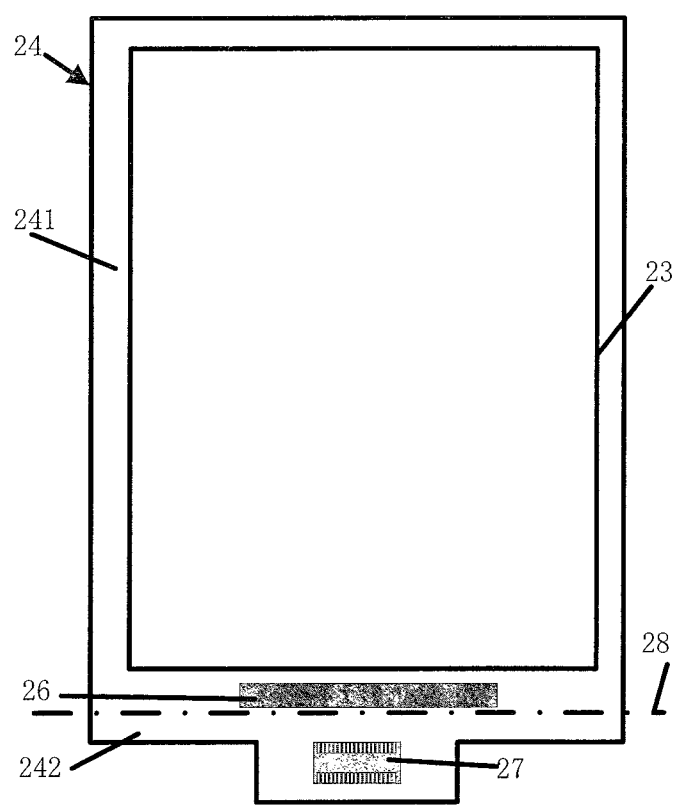
FIG. 3 is a plan view of the flexible display panel according to the embodiment of the present disclosure.

FIG. 3 is a plan view of the flexible display panel according to the embodiment. As shown in FIG. 3, the flexible substrate 24 of the display panel comprises a first portion 241 such as a central portion and a second portion 242 such as a peripheral portion. The display device 23 and the driver chip 26 are provided on the first portion 241 so as to form a display region of the flexible display panel, and the connector 27 is provided on the second portion 242. During assembling, at least part of the second portion 242 is bendable towards a back of the flexible display panel relative to the first portion 241 along a first fold line 28 located between the first portion 241 and the second portion 242; for example, the driver chip 26 and the connector 27 are positioned on two opposite sides of the flexible substrate 24 respectively by this bending, as shown in FIG. 2.

Figure 4:
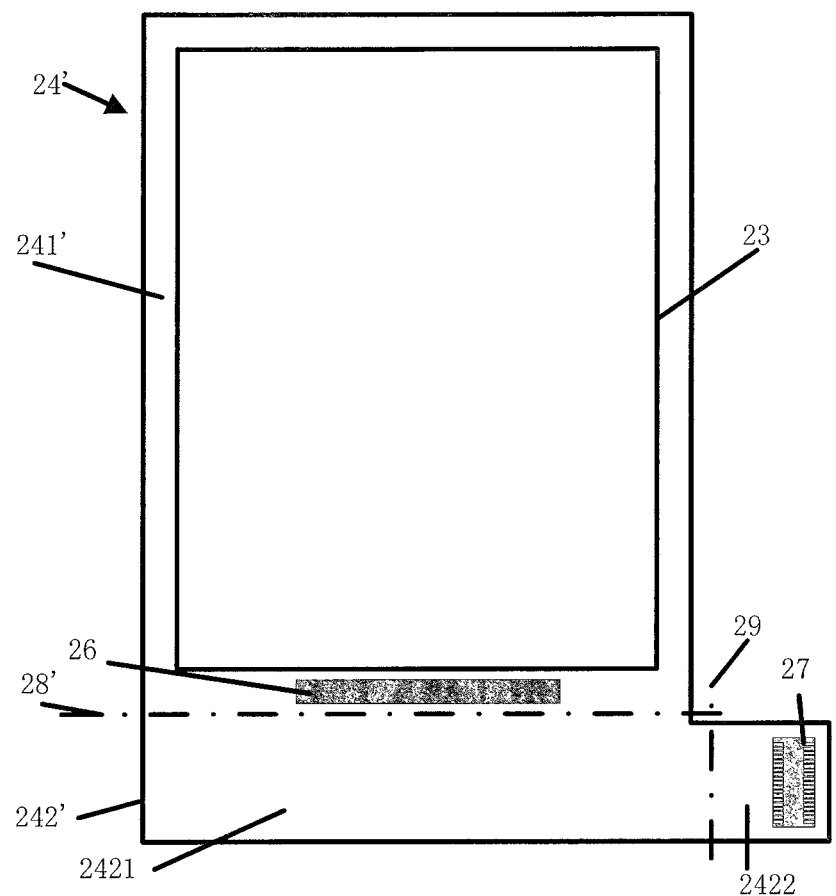
FIG. 4 is a plan view of a flexible display panel according to another embodiment of the present disclosure.

FIG. 4 is a plan view of a flexible display panel according to another embodiment. As shown in FIG. 4, a flexible substrate 24' of the display panel comprises a first portion 241' and a second portion 242'. The display device 23 and the driver chip 26 are provided on the first portion 241', and the second portion 242' is bendable towards a back of the flexible display panel relative to the first portion 241 along a first fold line 28' located between the first portion 241' and the second portion 242'. The second portion 242' further comprises a first region 2421 and a second region 2422. In the embodiment shown in FIG. 4, the connector 27 is provided on the second region 2422, and the second region 2422 is bendable towards the back of the flexible display panel relative to the first region 2421 along a second fold line 29 located between the first region 2421 and the second region 2422, thereby facilitating a connection with the system circuit board on the back. In the embodiment shown in FIG. 4, the second fold line 29 is perpendicular to the first fold line 28'.

In the above embodiments, the connector 27 is provided on the second portion 242 or 242' of the flexible substrate 24 or 24', so that during assembling, the connector 27 may be bended towards the back of the flexible display substrate along the fold line, thereby the connector 27 may be more firmly fixed on the flexible display substrate, and the connection between the connector 27 and the system circuit board is also facilitated.

In the above flexible display panel, the driver chip 26 and/or the connector 27 may be fixed on the flexible substrate 24 through a conductive adhesive, lead bonding (conducting wire bonding) or soldering. In an example, the conductive adhesive comprises an anisotropic conductive adhesive (ACF).

As an example, a conductive lead wire 32, such as a metal wire, is provided on the flexible substrate 24, and a pin 271, which is connected with the conductive lead wire 32, is provided on a bottom surface of the connector 27, such that the connector 27 is electrically connected to the driver chip 26 and/or the display device 23 through the conductive lead wire. In an example, the connector 27 may be made of a ceramic material. The pin is made of copper, the surface of the pin is plated with a metal material which has well conductivity and corrosion resistance, for example, gold or nickel alloy, and the pin comprises a protrusion having a certain thickness. Alternatively, a connection pin, which is subject to plating treatment, is formed on the flexible substrate 24 at a position where a connector or an external element will be connected, and is easily bondable with a tin solder, for soldering the connector.

The driver chip 26 is fixed on the flexible substrate 24 through lead bonding, electrically connected with the display device 23 of the flexible display panel via a conductive lead wire 31 (for example, a metal wire) manufactured through a sputtering, coating or printing process, and electrically connected with the connector 27 via a conductive lead wire 32.

The driver chip 26 and/or the connector 27 may be fixed on the flexible substrate 24 by using ACF, so that an upper surface of the connector 27 is flat, as shown in figures, resulting in a better heat conduction. Thus, heat may be conducted to the ACF between the flexible substrate 24 and the connector 27 during hot-pressing, facilitating easy flowing spread and solidification of the ACF.

Figure 5:
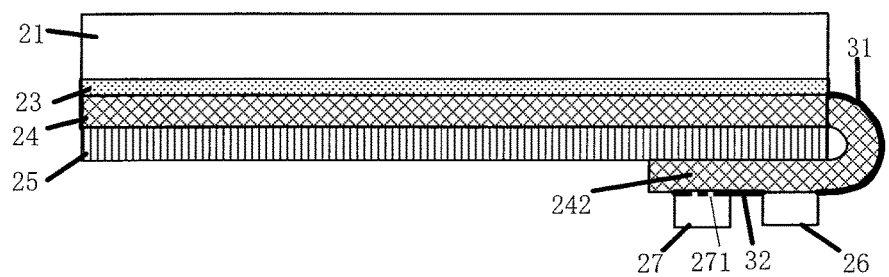
FIG. 5 is a side view of a flexible display panel according to a further embodiment of the present disclosure.

FIG. 5 is a side view of a flexible display panel according to a further embodiment. In the embodiments shown in FIGS. 3 and 4, the driver chip 26 is provided on the first portion 241 or 241' of the flexible substrate 24. Unlike them, the driver chip 26 is provided on the second portion 242 of the flexible substrate 24, as shown in FIG. 5. In this embodiment, both the driver chip 26 and the connector 27 are provided on the second portion, so that during assembling, they may be positioned on the back of flexible display panel through bending, thereby facilitating manufacturing a display panel having a narrower frame.

Figure 6:
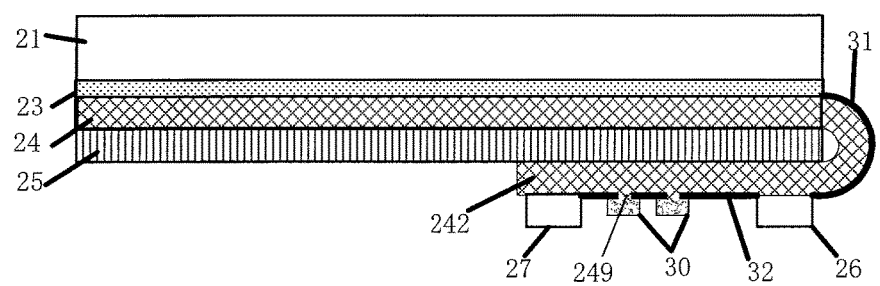
FIG. 6 is a side view of a flexible display panel according to a still further embodiment of the present disclosure.

FIG. 6 is a side view of a flexible display panel according to a still further embodiment. As shown in FIG. 6, the flexible display panel further comprises other elements 30 such as a resistor, a capacitor, an inductor, a diode and/or the like, which may be provided on the second portion 242. That is, during assembling, the other elements 30, as well as, the driver chip 26 and the connector 27, may be placed on the back of the flexible display panel through bending, thereby further facilitating manufacturing a display panel having a narrower frame. As an example, a connection pin 249, which is subject to plating treatment, is formed on the flexible substrate 24 at a position where an external element will be connected, for soldering elements such as a resistor, a capacitor, an inductor, a diode and/or the like.

Further, in one embodiment, a magnet (not shown) may be embedded in the connector 27, for connecting the connector to the system circuit board through attraction of the magnet.

According to an exemplary embodiments of the present disclosure, there is provided a flexible display apparatus, comprising the flexible display panel of any one of the embodiments as described above.

In the flexible display panel and the flexible display apparatus provided according to the present disclosure, the flexible substrate is used in place of a conventional COF or FPC, such that physical and electrical connections between the flexible display panel and the system circuit board (i.e., main board) are achieved directly through the flexible substrate, thereby eliminating steps of manufacturing and bonding the FPC, improving system integration, while reducing process complexity of manufacturing the flexible display panel.

Figure 7:
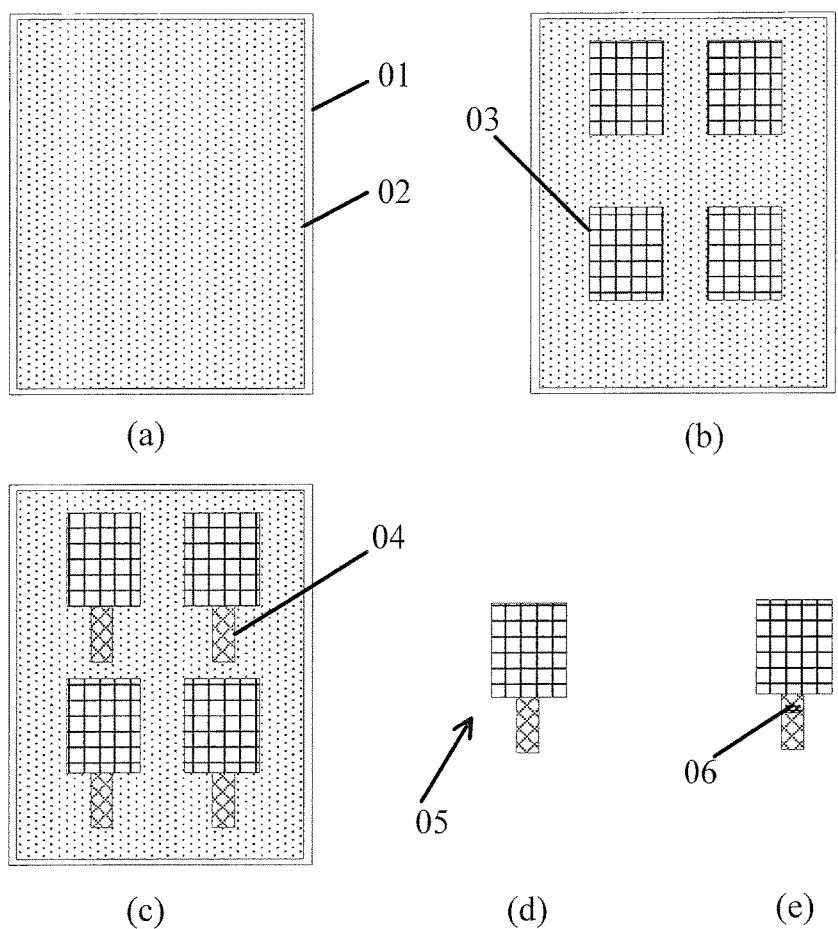
FIGS. 7(a)-(e) are schematic diagrams showing an exemplary method for manufacturing a flexible display panel according to the present disclosure.
Figure 8:
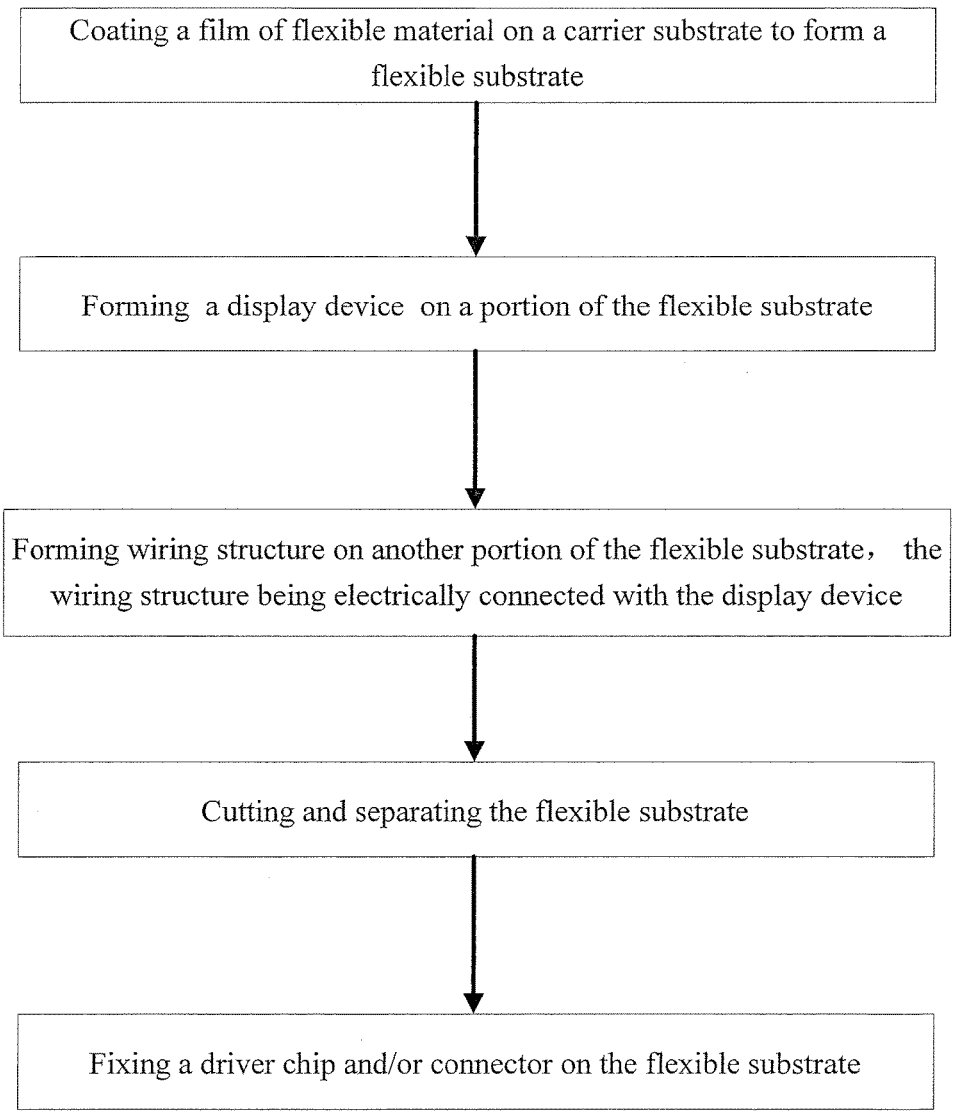
FIG. 8 is a flowchart of an exemplary method for manufacturing a flexible display panel according to the present disclosure.

FIG. 7 and FIG. 8 are respective schematic diagrams and flowchart showing an exemplary method for manufacturing the flexible display panel as described above. In an embodiment, as shown in FIGS. 7 and 8, the method mainly comprises following steps:

S1: coating a film of flexible material on a carrier substrate 01 to form a flexible substrate 02, as shown in FIG. 7(*a*);

In an embodiment, the flexible material may include a plastic material such as polyimide or the like, the operation of coating the film may be performed by using a process such as slot coating (slot die) or the like, and the carrier substrate may be glass carrier substrate or a quartz carrier substrate;

S2: performing panel associated processes, including semiconductor processes, on a portion of the flexible substrate 02 so as to form a display device 03, as shown in FIG. 7(*b*);

In an embodiment, the panel associated processes include wiring, arranging circuits, manufacturing the display device including a TFT device, a pixel unit or the like, and so on;

S3: forming a wiring structure 04 including the conductive lead wires and the like as described above, in place of the conventional FPC, on another portion of the flexible substrate, as shown in FIG. 7(*c*);

S4: cutting the flexible substrate 02 into a desired display panel shape by using, for example, a laser, and separating the flexible substrate 02 from the carrier substrate 01 by using, for example, a laser, so as to obtain a panel structure 05 including the display device and the wiring structure 04 that is directly formed on the flexible substrate 02, as shown in FIG. 7(*d*); and S5: fixing elements 06, such as a driver chip, a connector and the like, on the flexible substrate 02, for example on the another portion, and electrically connecting the elements 06 with display device 03 through the wiring structure, as shown in FIG. 7(e);

In an embodiment, the driver chip and/or the connector may be fixed on the flexible polyimide substrate through a conductive adhesive, lead bonding or soldering.

In the method, there is no need to provide a separate FPC or COF, the flexible substrate is avoided from being connected with the FPC or COF, and there is no additional external force (for example, adhesive force), thereby avoiding problems occurring during manufacturing the conventional flexible display panel, such as deformations, misalignment, tendency of falling off from the bonding region, and the like of the FPC and the flexible substrate during hot pressing, effectively reducing process complexity while improving system integration.

Although the present disclosure have been described with reference to the drawings, the embodiments disclosed in the drawings are intended to exemplarily illustrate embodiments of the present disclosure and should not be construed as being limitative to the present disclosure.

Although several exemplary embodiments according the general concept of the present disclosure have been shown and described, it would be appreciated by those skilled in the art that various changes or modifications may be made in these embodiments without departing from the principles and spirit of the invention, the scope of which is defined in the claims and their equivalents. Further, any reference numeral used in claims should not be understood as being limitative to the scope of the invention.

What is claimed is:

1. A flexible display panel, comprising a flexible substrate, a display device, a driver chip and a connector, the connector being configured to electrically connect the flexible display panel to a system circuit board, the display device, the driver chip and the connector being all provided on the flexible substrate and being in contact with the flexible substrate, such that the flexible display panel is physically and electrically connected to the system circuit board through the flexible substrate,
wherein
the flexible substrate comprises a first portion, on which the display device is provided, and a second portion, which is bendable towards a back of the flexible display panel relative to the first portion along a first fold line located between the first portion and the second portion; and
wherein the second portion further comprises a first region and a second region, the connector being provided on the second region, and the second region being bendable towards the back of the flexible display panel relative to the first region along a second fold line located between the first region and the second region.

2. The flexible display panel according to claim 1, further comprising a wiring structure directly formed on the flexible substrate and configured to electrically connect the display device, the driver chip and the connector.

3. The flexible display panel according to claim 1, wherein the flexible substrate is a unitary flexible substrate which is integrally formed.

4. The flexible display panel according to claim 1, wherein the connector, or both the connector and the driver chip, is/are provided on a portion of the flexible substrate which is bendable towards a back of the flexible display panel.

5. The flexible display panel according to claim 1, wherein
the connector is provided on the second portion, and
wherein the second portion is bendable towards a back of the flexible display panel relative to the first portion along a first fold line located between the first portion and the second portion such that the connector and the display device are positioned on two opposite sides of the flexible substrate respectively.

6. The flexible display panel according to claim 5, wherein the driver chip is provided on the second portion such that the driver chip and the display device are positioned on two opposite sides of the flexible substrate respectively.

7. A method of manufacturing the flexible display panel according to claim 1, comprising:
coating a film of flexible material on a carrier substrate to form the flexible substrate;
performing a semiconductor process on a portion of the flexible substrate so as to form the display device;
forming a wiring structure on another portion of the flexible substrate, the wiring structure being electrically connected with the display device;
cutting the flexible substrate into a desired display panel shape, and separating the flexible substrate from the carrier substrate, so as to obtain a panel structure including the display device and the wiring structure that is directly formed on the flexible substrate; and
fixing a driver chip and/or a connector on the flexible substrate of the obtained panel structure, and electrically connecting the driver chip and/or the connector with display device through the wiring structure.

8. The flexible display panel according to claim 1, wherein at least one of the driver chip and the connector is/are fixed on the flexible substrate through a conductive adhesive, lead bonding or soldering.

9. The flexible display panel according to claim 8, wherein the conductive adhesive includes an anisotropic conductive adhesive.

10. The flexible display panel according to claim 5, wherein at least one of the driver chip and the connector is/are fixed on the flexible substrate through a conductive adhesive, lead bonding or soldering.

11. The flexible display panel according to claim 1, wherein at least one of the driver chip and the connector is/are fixed on the flexible substrate through a conductive adhesive, lead bonding or soldering.

12. The flexible display panel according to claim 1, wherein a conductive lead wire is provided on the flexible substrate, and the connector has a pin connected with the conductive lead wire.

13. The flexible display panel according to claim 12, wherein the pin is made of copper, a surface of the pin is plated with gold or nickel alloy, and the pin comprises a protrusion having a ee thickness.

14. The flexible display panel according to claim 1, wherein the driver chip is provided on the second portion, and electrically connected with the connector and the display device via a conductive lead wire manufactured on the flexible substrate through a sputtering, coating or printing process.

15. The flexible display panel according to claim 5, wherein the flexible display panel further comprises at least one of a resistor, a capacitor, an inductor and a diode element, which are provided on the second portion.

16. The flexible display panel according to claim 1, wherein the flexible display panel further comprises at least one of a resistor, a capacitor, an inductor and a diode element, which are provided on the second portion.

17. The flexible display panel according to claim 1, wherein a connection pin, which is subject to plating treatment, is formed on the flexible substrate, for soldering to at least one of a connector, a resistor, a capacitor, an inductor and a diode element.

18. The flexible display panel according to claim 1, wherein a magnet is embedded in the connector, for connecting the connector to the system circuit board through attraction of the magnet.

19. A flexible display apparatus, comprising the flexible display panel as claimed in claim 1.

* * * * *